(12) United States Patent
Zhu et al.

(10) Patent No.: US 10,263,111 B2
(45) Date of Patent: Apr. 16, 2019

(54) FINFET AND METHOD FOR MANUFACTURING THE SAME

(71) Applicant: Institute of Microelectronics, Chinese Academy of Sciences, Beijing (CN)

(72) Inventors: Huilong Zhu, Poughkeepsie, NY (US); Miao Xu, Beijing (CN)

(73) Assignee: INSTITUTE OF MICROELECTRONICS, CHINESE ACADEMY OF SCIENCES, Poughkeepsie, NY (US)

( * ) Notice: Subject to any disclaimer, the term of this patent is extended or adjusted under 35 U.S.C. 154(b) by 0 days.

(21) Appl. No.: 14/647,736

(22) PCT Filed: Dec. 7, 2012

(86) PCT No.: PCT/CN2012/086155
§ 371 (c)(1),
(2) Date: May 27, 2015

(87) PCT Pub. No.: WO2014/082340
PCT Pub. Date: Jun. 5, 2014

(65) Prior Publication Data
US 2015/0325699 A1 Nov. 12, 2015

(30) Foreign Application Priority Data
Nov. 30, 2012 (CN) .......................... 2012 1 0506189

(51) Int. Cl.
*H01L 29/78* (2006.01)
*H01L 29/10* (2006.01)
(Continued)

(52) U.S. Cl.
CPC .... *H01L 29/7851* (2013.01); *H01L 21/02274* (2013.01); *H01L 21/308* (2013.01); *H01L 21/31111* (2013.01); *H01L 29/0843* (2013.01); *H01L 29/1083* (2013.01); *H01L 29/66636* (2013.01); *H01L 29/66795* (2013.01); *H01L 29/66803* (2013.01); *H01L 29/785* (2013.01); *H01L 29/7842* (2013.01); *H01L 29/7845* (2013.01); *H01L 29/7848* (2013.01); *H01L 29/7849* (2013.01); *H01L 21/26513* (2013.01); *H01L 29/165* (2013.01)

(58) Field of Classification Search
None
See application file for complete search history.

(56) References Cited

U.S. PATENT DOCUMENTS 8,518,807 B1 * 8/2013 Bedell .................. H01L 21/304
438/464
2003/0203596 A1 * 10/2003 Ho ..................... H01L 21/76224
438/437

(Continued)

FOREIGN PATENT DOCUMENTS

| CN | 1707808 | 12/2005 |
|---|---|---|
| CN | 101924133 | 12/2010 |
| CN | 102217074 | 10/2011 |

OTHER PUBLICATIONS

Chinese Office Action issued for related Chinese Patent Application No. 201210506189.2, dated Jan. 5, 2016; translation included.

(Continued)

*Primary Examiner* — Feifei Yeung Lopez
(74) *Attorney, Agent, or Firm* — Barnes and Thornburg LLP (57) ABSTRACT

A FinFET and a method for manufacturing the same are provided. The method includes: patterning a semiconductor substrate to form a ridge; performing ion implantation such that a doped punch-through-stopper layer is formed in the ridge and a semiconductor fin is formed by a portion of the semiconductor substrate disposed above the doped punch-through-stopper layer; forming a gate stack intersecting the semiconductor fin, the gate stack comprising a gate conductor and a gate dielectric isolating the gate conductor from the semiconductor fin; forming a gate spacer surrounding the gate conductor; and forming source and drain regions in portions of the semiconductor fin at opposite sides of the gate stack.

13 Claims, 10 Drawing Sheets

(51) Int. Cl.
*H01L 29/66* (2006.01)
*H01L 21/311* (2006.01)
*H01L 21/02* (2006.01)
*H01L 21/308* (2006.01)
*H01L 29/08* (2006.01)
H01L 21/265 (2006.01)
H01L 29/165 (2006.01)

(56) References Cited

U.S. PATENT DOCUMENTS

| | | | |
|---|---|---|---|
| 2005/0199920 A1 | 9/2005 | Lee et al. | |
| 2006/0244051 A1* | 11/2006 | Izumida | H01L 29/66818 257/327 |
| 2007/0128782 A1 | 6/2007 | Liu et al. | |
| 2008/0277745 A1* | 11/2008 | Hsu | H01L 29/66795 257/401 |
| 2009/0072276 A1* | 3/2009 | Inaba | H01L 21/823807 257/255 |
| 2013/0126972 A1* | 5/2013 | Wang | H01L 29/66795 257/351 |

OTHER PUBLICATIONS

Chinese Office Action issued for related Chinese Patent Application No. 201210506189.2, dated Oct. 10, 2016; translation is included.
International Search Report for related International Application No. PCT/CN2012/086155.
Third Office Action issued by the Chinese Patent Office for related Chinese Patent App. No. 201210506189.2, dated May 2, 2017, with translation.

\* cited by examiner

FINFET AND METHOD FOR MANUFACTURING THE SAME

CROSS-REFERENCE TO RELATED APPLICATIONS

This application is a U.S. national phase application of PCT Application No. PCT/CN2012/086155, filed on Dec. 7, 2012, entitled "FINFET AND MANUFACTURING METHOD THEREOF," which claims priority to Chinese Application No. 201210506189.2, filed on Nov. 30, 2012. Both the PCT Application and the Chinese Application are incorporated herein by reference in their entireties.

TECHNICAL FIELD

The present disclosure relates to the semiconductor technology, and particularly, to a FinFET and a method for manufacturing the same.

BACKGROUND

With the scaling down of semiconductor devices, short channel effects become increasingly significant. In order to suppress the short channel effects, Fin Field Effect Transistors (FinFETs) formed on SOI wafers or bulk semiconductor substrates have been proposed. The FinFET comprises a channel region formed in a central portion of a fin of semiconductor material and source/drain regions formed at opposite ends of the fin. A gate electrode is provided on opposite sides of the channel region to surround the latter (i.e., a double-gate configuration), in which an inversion layer is formed at each side of the channel. As the whole channel region can be controlled by the gate, the short channel effects can be suppressed.

When being lot-produced, FinFETs manufactured by using bulk semiconductor substrates have higher cost efficiency than those manufactured by using SOI wafers and thus are widely used. For a FinFET using a semiconductor substrate, however, it is difficult to control the height of the semiconductor fin, and a conductive path may be formed between the source region and the drain region via the semiconductor substrate, causing a problem of leakage current.

In order to reduce the leakage current between the source region and the drain region, a doped punch-through-stopper layer may be formed under the semiconductor fin. For example, the doped punch-through-stopper layer is provided by forming a doped region through ion implantation into the semiconductor substrate, and then a portion of the semiconductor substrate disposed above the doped punch-through-stopper layer is patterned into the semiconductor fin.

However, it is difficult to form a clear boundary for the doped region due to the concentration distribution of the doped region. It is difficult to well define the position in depth and thickness of the punch-through-stopper layer provided by the doped region. It is also difficult to well define the thickness of the semiconductor fin above the doped punch-through-stopper layer. A transition area between the semiconductor fin and the doped punch-through-stopper layer may become a potential leakage current path and cause undesired random change in the threshold voltage of the FinFET.

SUMMARY

The present disclosure aims to, among others, reduce leakage current between source and drain regions in a semiconductor substrate based FinFET and reduce a random change in threshold voltage of the FinFET.

In accordance with an aspect of the present disclosure, there is provided a method for manufacturing a FinFET, the method comprising: patterning a semiconductor substrate to form a ridge; performing ion implantation such that a doped punch-through-stopper layer is formed in the ridge and a semiconductor fin is formed by a portion of the semiconductor substrate disposed above the doped punch-through-stopper layer; forming a gate stack intersecting the semiconductor fin, the gate stack comprising a gate conductor and a gate dielectric isolating the gate conductor from the semiconductor fin; forming a gate spacer surrounding the gate conductor; and forming source and drain regions in portions of the semiconductor fin at opposite sides of the gate stack.

In accordance with another aspect of the present disclosure, there is provided a FinFET, comprising: a semiconductor substrate; a doped punch-through-stopper layer disposed on the semiconductor substrate; a semiconductor fin disposed above the doped punch-through-stopper layer; a gate stack intersecting the semiconductor fin, the gate stack comprising a gate conductor and a gate dielectric isolating the gate conductor from the semiconductor fin; source and drain regions disposed at opposite ends of the semiconductor fin, wherein both the doped punch-through-stopper layer and the semiconductor fin are formed by the semiconductor substrate.

In the FinFET disclosed herein, the semiconductor fin is separated from the semiconductor substrate by the doped punch-through-stopper layer, such that the leakage current path between the source region and the drain region via the semiconductor substrate can be cut off. As the ion implantation is performed after the ridge is formed, a steep doping distribution can be formed in a depth direction of the ridge, such that it is possible to better define upper and lower boundaries of the doped punch-through-stopper layer and thus the height of the semiconductor fin disposed above the doped punch-through-stopper layer. The FinFET disclosed herein can reduce the leakage current and the random change in threshold voltage. In a preferable embodiment, the source and drain regions formed in a stress application layer may apply appropriate stress to a channel region in the semiconductor fin to improve mobility of carriers.

BRIEF DESCRIPTION OF THE DRAWINGS

The foregoing and other objects, features, and advantages of the present disclosure will become more apparent from the following descriptions of embodiments with reference to the accompanying drawings, in which.

DETAILED DESCRIPTION

Next, the technology of the present disclosure will be explained in detail with reference to the drawings. Like components are indicated by like reference numerals throughout the drawings. The drawings are not drawn to scale for purpose of clarity.

A semiconductor structure obtained after several steps may be illustrated in a single figure for conciseness.

It will be understood that, in describing a structure of a device, when a layer or region is referred to as being arranged "on" or "above" another layer or region, the layer or region may be directly on or above the other layer region, or there may be one or more other layers or regions interposed therebetween. When the device is turned over, the layer or region will be "under" or "below" the other layer or region. If the layer or region is to be directly arranged on the other layer or region, it will be described as "directly on" or "on and abutting" the other layer or region.

In the present disclosure, the terminology "semiconductor structure" generally refers to a structure that has been formed after respective steps in manufacturing a semiconductor device and comprises all layers or regions that have been formed. Various specific details of the present disclosure, such as structures, materials, sizes, and manufacturing processes and technologies of the device, will be described in the following to facilitate understanding of the present disclosure. However, one of ordinary skill in the art will understand that the present disclosure can be implemented without theses specific details.

Unless otherwise indicated, respective parts of a FinFET can be formed of materials well known to one of ordinary skill in the art. A semiconductor material may comprise a III-V Group semiconductor material, such as GaAs, InP, GaN, and SiC, or a IV Group semiconductor material, such as Si or Ge. A gate conductor may comprise any conductive material, such as metal, doped polysilicon, a stack of metal and doped polysilicon, or any other conductive material, such as TaC, TiN, TaTbN, TaErN, TaYbN, TaSiN, HfSiN, MoSiN, RuTax, NiTax, MoNx, TiSiN, TiCN, TaAlC, TiAlN, TaN, PtSix, $Ni_3Si$, Pt, Ru, Ir, Mo, HfRu, and RuOx. The gate conductor may also be any combination of the foregoing conductive materials. A gate dielectric may comprise $SiO_2$ or any other material having a dielectric constant greater than that of $SiO_2$. Such material may comprise, e.g., oxide, nitride, oxynitride, silicide, aluminate, or titanate. The oxide may comprise, e.g., $SiO_2$, $HfO_2$, $ZrO_2$, $Al_2O_3$, $TiO_2$, or $La_2O$. The nitride may comprise, e.g., $Si_3N_4$. The silicide may comprise, e.g., $HfSiO_x$. The aluminate may comprise, e.g., $LaAlO_3$. The titanate may comprise, e.g., $SrTiO_3$. The oxynitride may comprise, e.g., SiON. The gate dielectric may comprise any suitable material well known to one of ordinary skill in the art or any suitable material that might be developed in the future.

The technology of the present disclosure can be implemented in various ways, some examples of which will be described in the following.

Referring to FIGS. 1 to 6, an exemplary process of a method for manufacturing a semiconductor device in accordance with a first embodiment of the present disclosure is illustrated. Among them, FIGS. 5a-6a show top views of semiconductor structures and positions where sectional views of the semiconductor structures are to be taken, FIGS. 1-4 and 5b-6b show sectional views of the semiconductor structures taken along A-A line in a width direction of a semiconductor fin, and FIGS. 5c-6c show sectional views of the semiconductor structures taken along B-B line in a length direction of the semiconductor fin.

Figure 1:
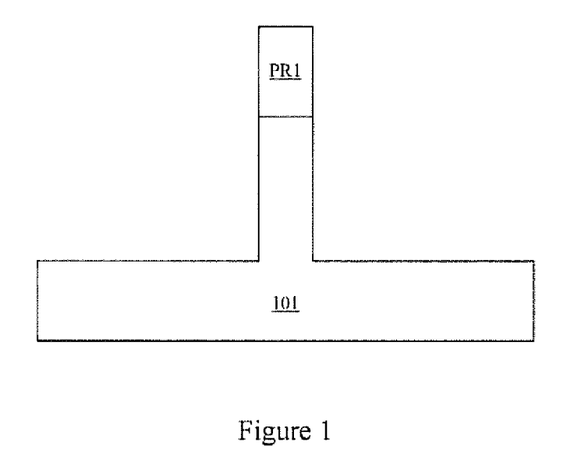
FIGS. 1 to 6 are schematic views showing semiconductor structures in respective stages of a method for manufacturing a semiconductor device according to a first embodiment of the present disclosure, wherein FIG. 4 further shows a doping distribution in a doped punch-through-stopper layer.

As shown in FIG. 1, a photo-resist layer PR1 is formed on a semiconductor substrate 101 by spin coating, and then patterned, by photolithography including exposure and development, into a pattern to define a shape (e.g., strip) for a semiconductor fin to be formed. Exposed portions of the semiconductor substrate 101 are removed by dry etching, such as ion milling, plasma etching, Reactive Ion Etching (RIE), or laser ablation, or wet etching with an etchant solution, with the photo-resist layer PR1 as a mask. The etching depth into the semiconductor substrate 101 may be controlled through controlling the etching duration, such that openings are formed in the semiconductor substrate 101 and a ridge is defined between the openings.

Next, the photo-resist layer PR1 is removed by being solved in a solvent or being ashed. A first insulating layer 102 (e.g. silicon oxide) is formed on the surface of the semiconductor structure by e.g. High Density Plasma (HDP) deposition process to fill the openings in the semiconductor substrate 101. By controlling parameters of the deposition process, a portion of the first insulating layer 102 disposed on top of the ridge has a thickness much smaller than that of a portion of the first insulating layer 102 disposed within the opening between the ridges. Preferably, the thickness of the portion of the first insulating layer 102 disposed on top of the ridge is smaller than ⅓, more preferably ¼, the thickness of the portion of the first insulating layer 102 disposed within the opening between the ridges. Further preferably, the thickness of the portion of the first insulating layer 102 disposed on top of the ridge is smaller than half of a spacing between the ridges (i.e., the width of the opening). In one embodiment of the present disclosure, the thickness of the portion of the first insulating layer 102 disposed with in the opening is greater than 80 nm, and the thickness of the portion of the first insulating layer 102 disposed on top of the ridge is smaller than 20 nm.

Figure 2:
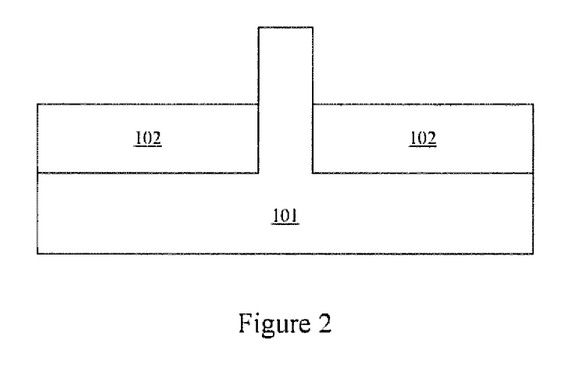

The first insulating layer 102 is etched back by selective etching (e.g., RIE), as shown in FIG. 2. Through the etching, the portion of the first insulating layer 102 disposed on top of the ridge is removed and the thickness of the portion of the first insulating layer 102 disposed within the opening is reduced. The first insulating layer 102 defines a depth of the opening. The etching duration is controlled such that the depth of the opening is substantially equal to the height of the semiconductor fin to be formed.

Figure 3:
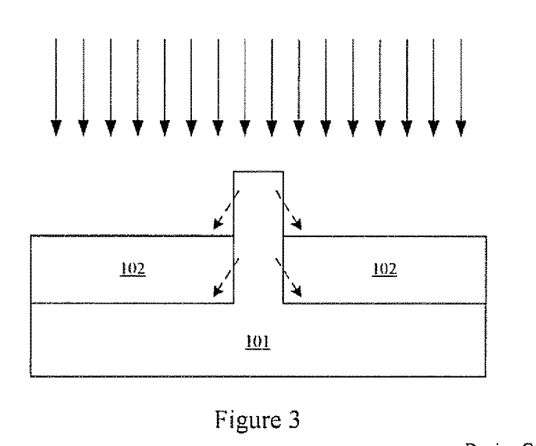

Next, ion implantation is performed without a mask, as shown in FIG. 3. This results in a doped region in the semiconductor substrate 101 to provide a doped punch-through-stopper layer. As indicated by solid arrows in the figure, ion implantation may be performed in a direction substantially perpendicular to the surface of the semiconductor structure. Parameters of the ion implantation are controlled such that the doped region is disposed at a predetermined depth in the ridge of the semiconductor substrate 101 and has a desired doping concentration. It is to be noted that due to the form factor of the ridge, some of the dopants (e.g., ions or elements) may be scattered from the ridge to the first insulating layer 102 to facilitate forming a steep doping distribution in the depth direction. The first insulating layer 102 prevents the dopants from further entering the portion of the semiconductor substrate 101 disposed within the opening. In addition, the dopants that have entered the first insulating layer 102 may be scattered to the ridge to form a doping distribution in the width direction of the semiconductor fin.

Figure 4:
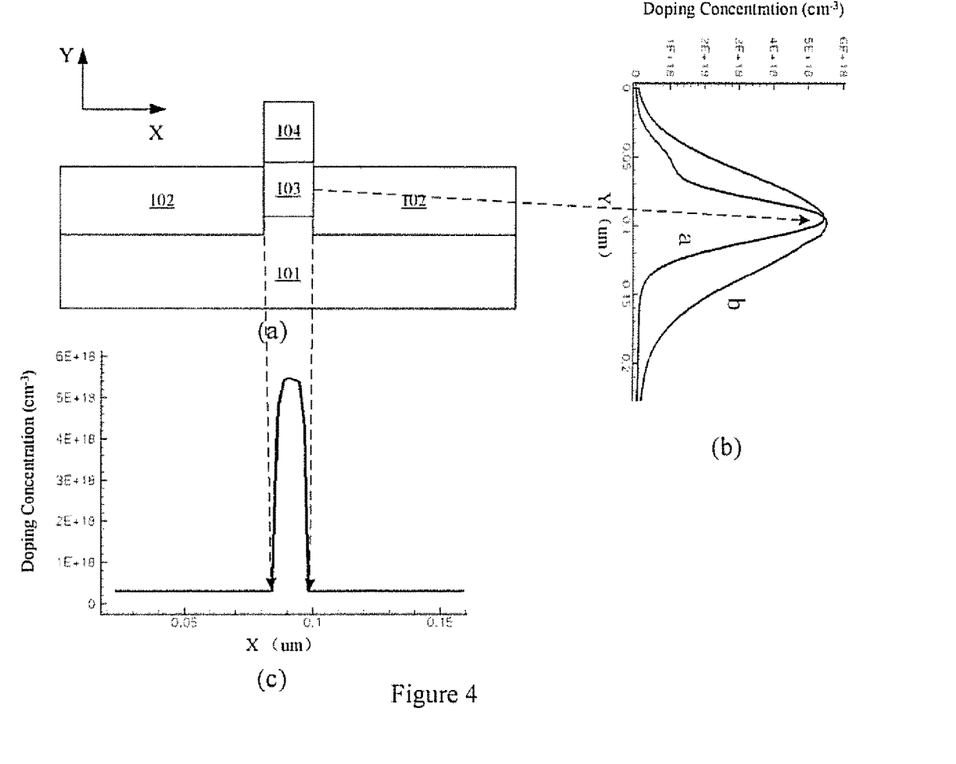

During the ion implantation, different dopants may be used for different types of FinFETs. P-type dopants such as B or In may be used for an n-type FinFET, and n-type dopants such as P or As may be used for a p-type FinFET. The doping type of the doped punch-through-stopper layer to be formed is opposite to the doping type of source and drain regions, such that the leakage current path between the source and drain regions can be cut off. After the ion implantation, a doped punch-through-stopper layer 103 is provided by the doped region formed in the ridge of the semiconductor substrate 101, as shown in FIG. 4(a). A portion of the ridge disposed above the doped punch-through-stopper layer 103 constitutes a semiconductor fin 104. In addition, the semiconductor fin 104 is separated from the semiconductor substrate 101 by the doped punch-through-stopper layer 103.

Referring to FIG. 4(b), curve a illustrates a doping concentration distribution in the depth direction (i.e., along Y axis shown in FIG. 4(a)) after the ion implantation which is performed after the ridge is formed according to the technology disclosed herein, and curve b illustrates a doping concentration distribution in the depth direction after ion implantation which is performed across a flat semiconductor substrate (i.e., a semiconductor substrate on which the ridge has not been formed) in prior art. In one embodiment, a simulated doping concentration distribution curve a is illustrated in which In is implanted after the ridge is formed and the depth is chosen to be about 0.2 µm. As compared to the prior art, the doped region obtained by performing ion implantation after the ridge is formed in accordance with the method of the present disclosure has a steeper doping concentration distribution in the depth direction.

Referring to FIG. 4(c), a curve illustrates a doping concentration distribution in the width direction of the semiconductor fin (i.e., along x axis shown in FIG. 4(a)) after the ion implantation which is performed after the ridge is formed according to the technology disclosed herein. In one embodiment, a simulated doping concentration distribution curve a is illustrated in which In is implanted after the ridge is formed and the depth is chosen to be about 0.2 µm. As compared to the prior art, the doped region obtained by performing ion implantation after the ridge is formed in accordance with the method of the present disclosure has a steeper doping concentration distribution in the width direction. As the dopants that have entered the first insulating layer 102 can be diffused to the ridge, a doping distribution is also formed in the width direction. In accordance with the method of the present disclosure, the doped punch-through-stopper layer obtained by performing ion implantation after the ridge is formed has a higher doping concentration in its central part than that in its opposite ends.

Next, a gate dielectric layer 105 (e.g., silicon oxide or silicon nitride) is formed by a known deposition process, such as Electron Beam evaporation (EBM), Chemical Vapor Deposition (CVD), Atom Layer Deposition (ALD), sputtering or the like, on the surface of the semiconductor structure. In one example, the gate dielectric layer 105 is a silicon oxide layer having a thickness of about 0.8-1.5 nm. Top and side surfaces of the semiconductor fin 104 are covered by the gate dielectric layer 105.

A conductor layer (e.g., doped polycrystalline silicon) is formed on the surface of the semiconductor structure by the known deposition process as described above. The conductor layer may be subjected to Chemical Mechanical Polishing (CMP) to have a flat surface if necessary.

Figure 5A:
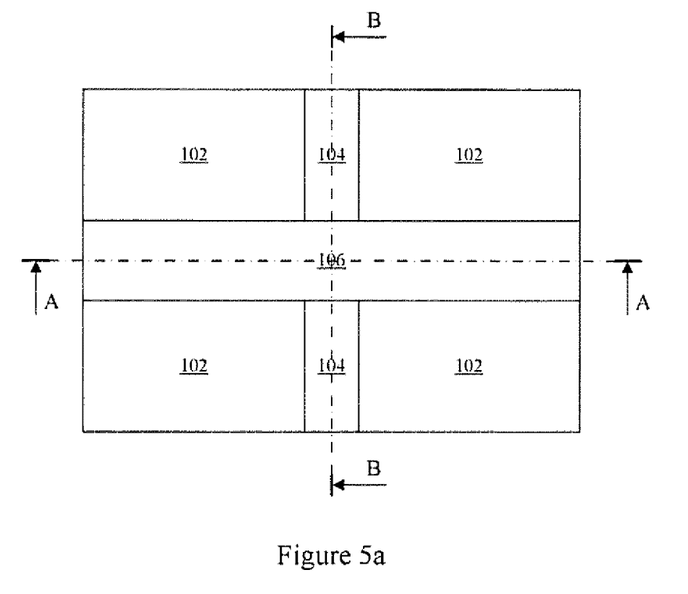
Figure 5B:
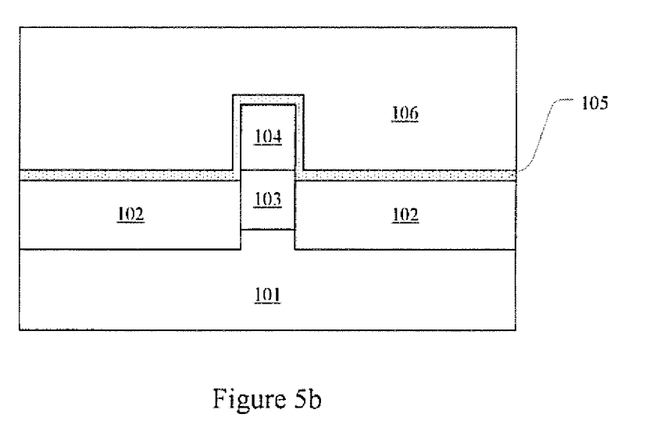
Figure 5C:
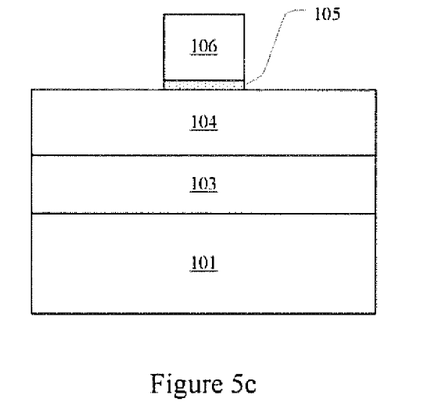

By using a photoresist mask, the conductor layer is patterned to a gate conductor 106 intersecting the semiconductor fin, and exposed portions of the gate dielectric layer 105 are further removed, as shown in FIGS. 5a, 5b and 5c. A gate stack is formed by the gate conductor 106 together with the gate dielectric layer 105. In the example illustrated in FIGS. 5a, 5b and 5c, the gate conductor 106 has a shape of strip and extends in a direction substantially perpendicular to the length direction of the semiconductor fin.

Figure 6A:
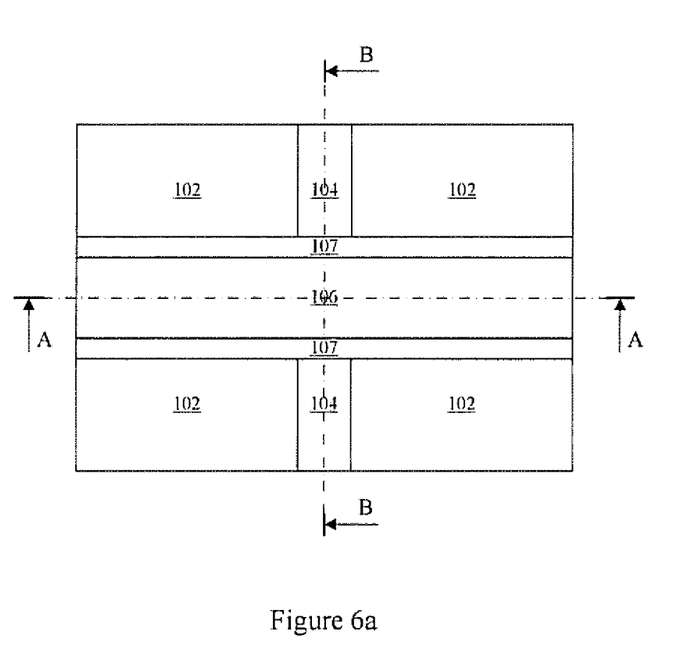
Figure 6B:
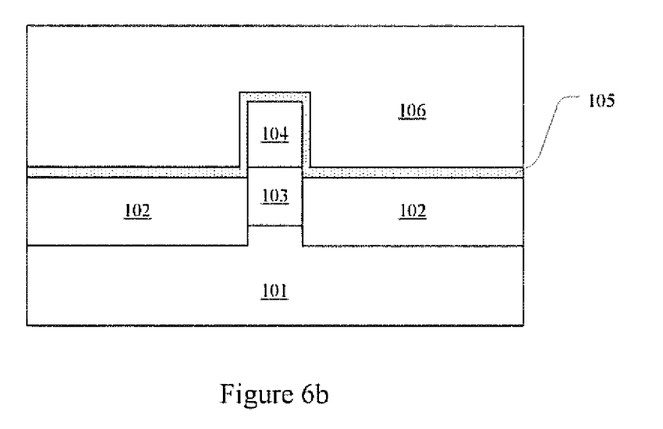
Figure 6C:
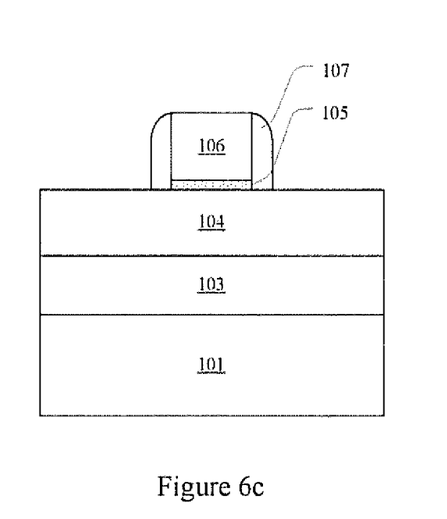

Next, a nitride layer is formed on the surface of the semiconductor structure by the known deposition process as describe above. In one example, the nitride layer is a silicon nitride layer having a thickness of about 5-20 nm. Laterally extending portions of the nitride layer are removed by anisotropic etching (e.g., reactive ion etching) to leave vertical portions of the nitride layer disposed on side surfaces of the gate conductor 106, resulting in a gate spacer 107, as shown in FIGS. 6a, 6b and 6c. Generally, portions of the nitride layer on the side surfaces of the semiconductor fin 104 has a smaller thickness than those on the side surfaces of the gate conductor 106 due to the form factor, and thus it is possible to completely remove the portions of the nitride layer on the side surfaces of the semiconductor fin 104 in the etching. The portions of nitride layer on the side surfaces of the semiconductor fin 104, if having an excessive thickness, may hamper the formation of the gate spacer. In this case, the portions of the nitride layer on the semiconductor fin 104 may be further removed by using an additional mask.

Portions of the semiconductor fin 104 disposed on opposite sides of the gate conductor 106 have their top and side surfaces exposed by the etching. After that, source and drain regions may be formed in the exposed portions of the semiconductor fin 104 by conventional process.

Figure 7A:
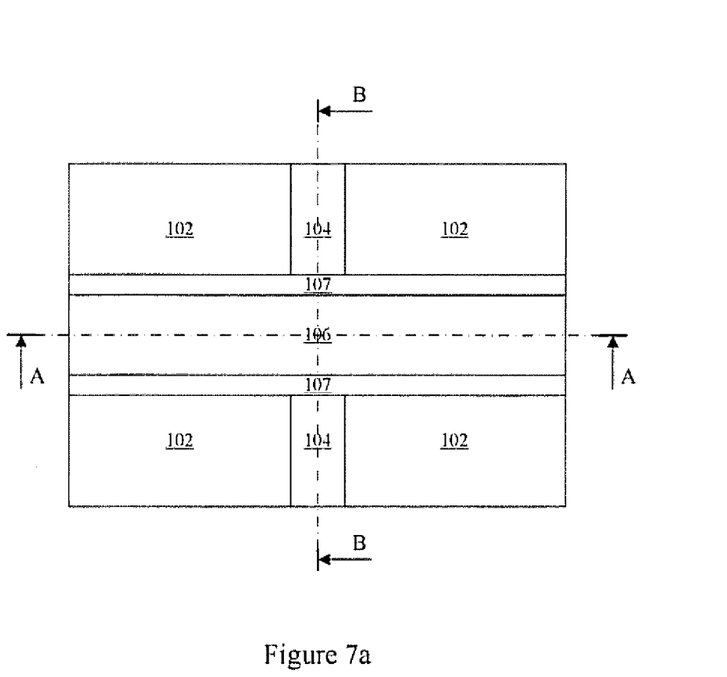
FIGS. 7-9 are schematic views showing semiconductor structures in some of stages of a method for manufacturing a semiconductor device according to a preferable embodiment of the present disclosure.
Figure 7B:
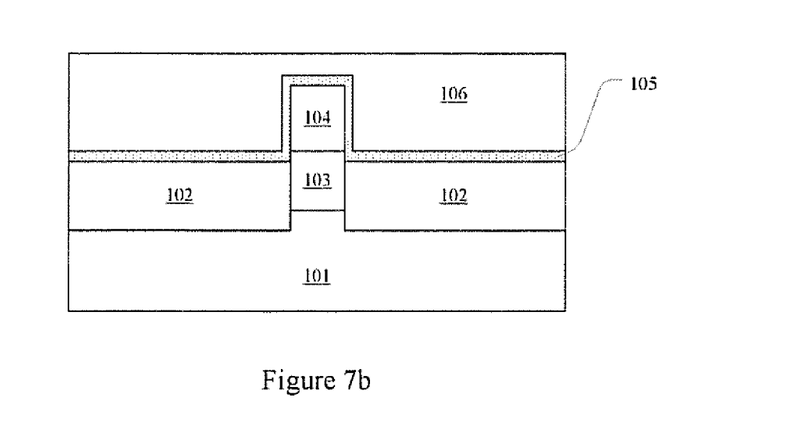
Figure 7C:
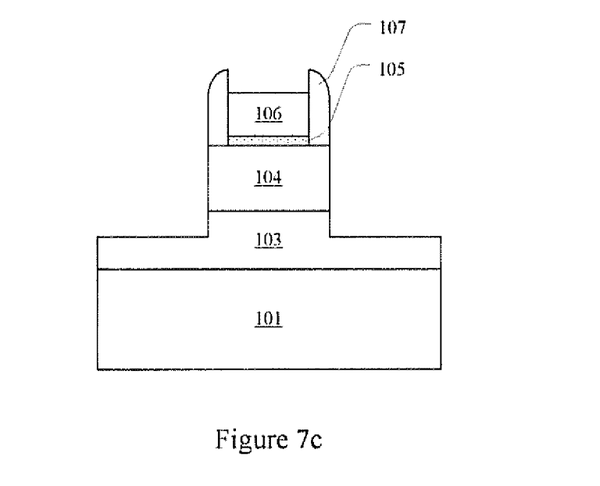
Figure 8A:
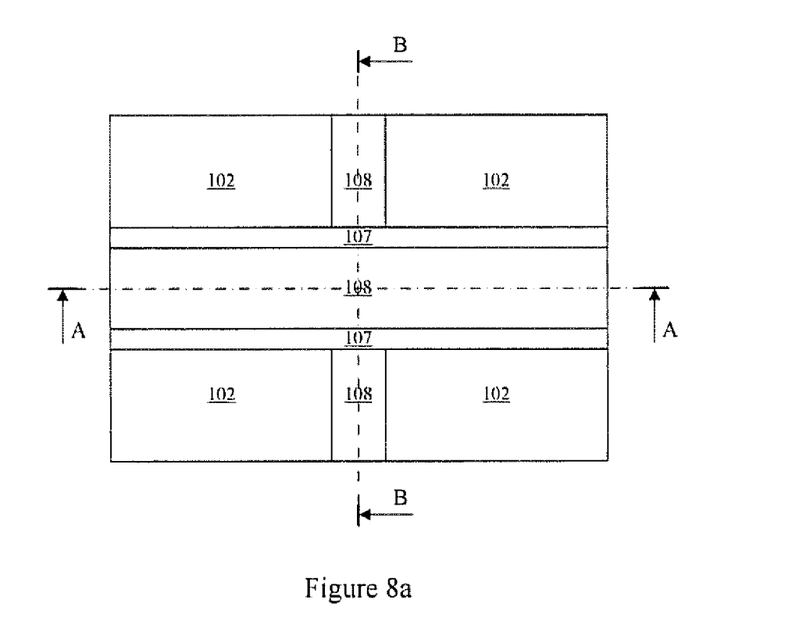
Figure 8B:
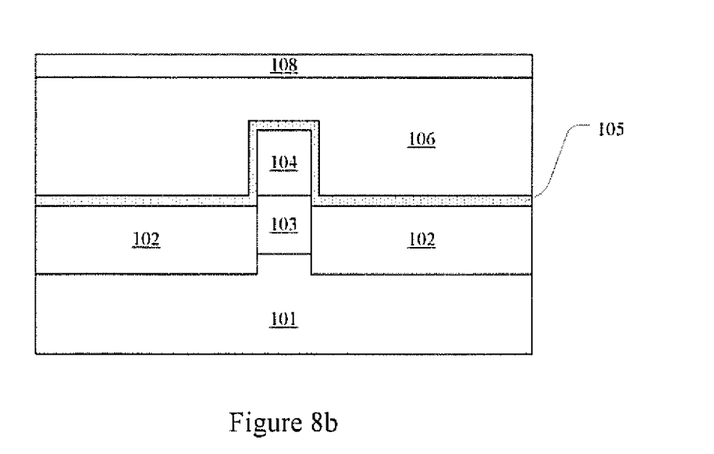
Figure 8C:
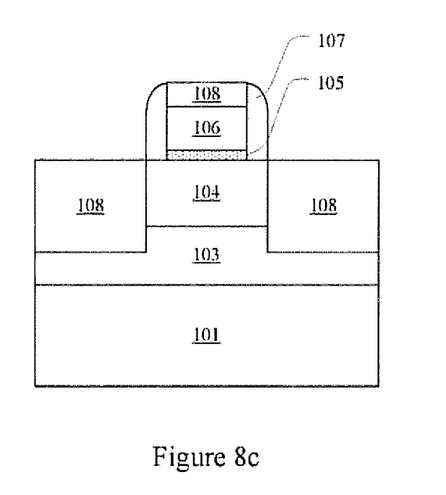
Figure 9A:
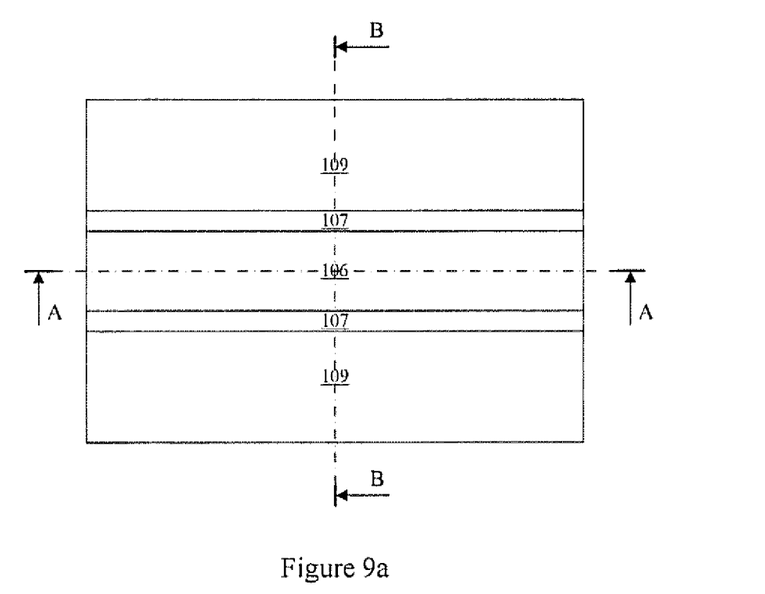
Figure 9B:
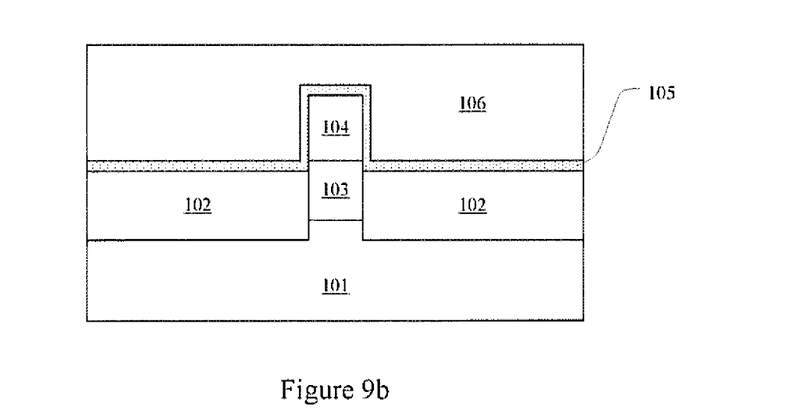
Figure 9C:
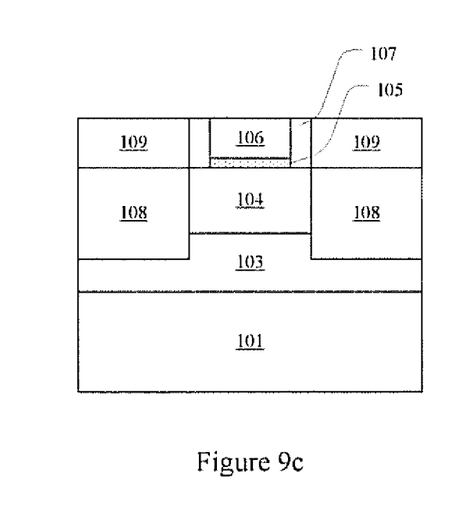

Referring to FIGS. 7 to 9, some of stages of a method for manufacturing a semiconductor device in accordance with a preferable embodiment of the present disclosure are illustrated. Among them, FIGS. 7a-9a show top views of semiconductor structures and positions where sectional views of the semiconductor structures are to be taken, FIGS. 7b-9b show sectional views of the semiconductor structures taken along A-A line in a width direction of a semiconductor fin, and FIGS. 7c-9c show sectional views of the semiconductor structures taken along B-B line in a length direction of the semiconductor fin.

According to the preferable embodiment, steps shown in FIGS. 7-9 are performed after the step shown in FIG. 6 in order to form a stress application layer and then form source and drain regions in the stress application layer.

The portions of the semiconductor fin 104 disposed at opposite sides of the gate conductor 106 are selectively removed with respective to the gate spacer 107 by the known etching process as described above (e.g., RIE), as shown in FIGS. 7a, 7b and 7c. The etching may stop at the top surface of the doped punch-through-stopper layer 103 or further remove a part of the doped punch-through-stopper layer 103 (as shown in FIG. 7c). It is also possible to remove a part of the gate conductor 106 by the etching. The etching merely reduces the thickness of the gate conductor 106 without completely remove the gate conductor 106 because the thickness of the gate conductor 106 may be much greater than the height of the semiconductor fin 104 (as shown in FIG. 7c).

Next, a stress application layer 108 is epitaxially grown on the doped punch-through-stopper layer 103 by the deposition process as described above, as shown in FIGS. 8a, 8b and 8c. The stress application layer 108 is also formed on the gate conductor 106. The stress application layer 108 should be thick enough to make the top surface of the stress application layer 108 to be higher than or flush with the top surface of the semiconductor fin 104 in order to maximize the stress applied to the semiconductor fin 104.

Different stress application layers 108 may be formed for different types of FinFETs. Appropriate stress may be applied to a channel region of the FinFET by the stress application layer 108 to increase the mobility of carriers, reducing the conducting resistance and increasing the switching speed of the device. To this end, source and drain regions are formed by a semiconductor material different from that of the semiconductor fin 104 in order to create the desired stress. With respect to an n-type FinFET, the stress application layer 108 may comprise, for example, a Si:C layer with an atomic percentage of C of about 0.2-2%, which is formed on a Si substrate, so as to apply tensile stress to the channel region in a longitudinal direction of the channel region. With respect to a p-type FinFET, the stress application layer 108 may comprise, for example, a SiGe layer with an atomic percentage of Ge of about 15-75%, which is formed on a Si substrate, so as to apply compressive stress to the channel region in the longitudinal direction of the channel region.

Next, a second insulating layer 109 (e.g., silicon oxide) is formed on the surface of the semiconductor structure by the known deposition process as described above. The semiconductor structure is subjected to CMP to have a flat surface, as shown in FIGS. 9a, 9b and 9c. The CMP removes a portion of the second insulating layer 109 disposed above the gate conductor 110 to expose the stress application layer 108 above the gate conductor 110 and the gate spacer 111. Further, the CMP may remove the stress application layer 108 above the gate conductor 110 and a portion of the gate spacer 111, in order to expose the gate conductor 106.

According to various embodiments as described above, after the source and drain regions are formed, it is possible to form on the resultant semiconductor structure an interlayer insulating layer, vias in the insulating layer, wirings or electrodes on an upper surface of the interlayer insulating layer in order to complete other parts of the FinFET.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above. The mere fact that the various embodiments are described separately does not imply that measures in the respective embodiments cannot be used in combination to advantage.

From the foregoing, it will be appreciated that specific embodiments of the disclosure have been described herein for purposes of illustration, instead of limiting the present disclosure. The technology is not limited except as by the appended claims. Various modifications may be made without deviating from the disclosure, and thus all fall within the scope of the technology.

We claim:

1. A method for manufacturing a FinFET, comprising the steps of:
   patterning a semiconductor substrate to form a ridge;
   forming an isolation layer on the semiconductor substrate, the isolation layer exposes the ridge;
   performing ion implantation to the isolation layer and the ridge without using a mask to the ridge such that a doped punch-through-stopper layer is formed in the ridge and a semiconductor fin is formed by a portion of the semiconductor substrate disposed above the doped punch-through-stopper layer;
   forming a gate stack intersecting the semiconductor fin, the gate stack comprising a gate conductor and a gate dielectric isolating the gate conductor from the semiconductor fin;
   forming a gate spacer surrounding the gate conductor; and
   forming source and drain regions in portions of the semiconductor fin at opposite sides of the gate stack,
   wherein during the forming of the doped punch-through-stopper layer, the doped punch-through-stopper layer forms a doping concentration with steep distribution in a depth direction, and forms a doping concentration with steep distribution in a width direction within the doped punch-through-stopper layer, and wherein the doping concentration in the width direction varies continuously and is high at middle and low at both sides in the width direction within the doped punch-through-stopper layer.

2. The method according to claim 1, wherein the step of forming an insulating layer comprises:
   forming the insulating layer by high density plasma deposition, such that the portion of the insulating layer disposed within the openings has a thickness much greater than that of the portion of the insulating layer disposed on top of the ridge.

3. The method according to claim 2, wherein the thickness of the portion of the insulating layer disposed on top of the ridge is smaller than ⅓ the thickness of the portion of the insulating layer disposed within the openings.

4. The method according to claim 1, wherein the FinFET is of n-type and the doped punch-through-stopper layer is doped with p-type dopants.

5. The method according to claim 1, wherein the FinFET is of p-type and the doped punch-through-stopper layer is doped with n-type dopants.

6. The method according to claim 1, wherein the step of forming source and drain regions comprises the steps of:
   etching exposed portions of the semiconductor fin with the gate spacer and the gate conductor as a mask to expose the doped punch-through-stopper layer, such that openings arriving at the doped punch-through-stopper layer are formed at opposite sides of the gate conductor;
   forming within the openings a stress application layer made of a material different from that of the semiconductor fin; and
   forming source and drain regions in the stress application layer.

7. A FinFET, comprising:
   a semiconductor substrate;
   a doped punch-through-stopper layer disposed on the semiconductor substrate;
   a semiconductor fin disposed above the doped punch-through-stopper layer;
   a gate stack intersecting the semiconductor fin, the gate stack comprising a gate conductor and a gate dielectric isolating the gate conductor from the semiconductor fin;
   source and drain regions disposed at opposite ends of the semiconductor fin, wherein both the doped punch-through-stopper layer and the semiconductor fin are formed by the semiconductor substrate, a doping distribution concentration in an area near the doped punch-through-stopper layer in a depth direction at the semiconductor fin varies gently, and a doping concentration with steep distribution is formed in both a depth direction and a width direction within the doped punch-through-stopper layer, and wherein the doping concentration in the width direction varies continuously and is high at middle and low at both sides in the width direction within the doped punch-through-stopper layer.

8. The FinFET according to claim 7, wherein the FinFET is of n-type and the doped punch-through-stopper layer is of p-type.

9. The FinFET according to claim 7, wherein the FinFET is of p-type and the doped punch-through-stopper layer is of n-type.

10. The FinFET according to claim 7, further comprising an insulating layer to isolate the gate conductor from the semiconductor substrate.

11. The FinFET according to claim 7, wherein the source and drain regions are made of a material different from that of the semiconductor fin.

12. The FinFET according to claim 11, wherein the FinFET is of n-type, the semiconductor fin comprises Si, and the source and drain regions comprise Si:C, with an atomic percentage of C of about 0.2-2%.

13. The FinFET according to claim 11, wherein the FinFET is of p-type, the semiconductor fin comprises Si, and the source and drain regions comprise SiGe, with an atomic percentage of Ge of about 15-75%.

* * * * *